United States Patent
Kim et al.

(10) Patent No.: US 7,280,422 B2
(45) Date of Patent: Oct. 9, 2007

(54) BLEQ DRIVING CIRCUIT IN SEMICONDUCTOR MEMORY DEVICE

(75) Inventors: Kyoung-Nam Kim, Ichon-shi (KR); Kang-Seol Lee, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/019,496

(22) Filed: Dec. 23, 2004

(65) Prior Publication Data

US 2005/0232042 A1    Oct. 20, 2005

(30) Foreign Application Priority Data

Apr. 20, 2004    (KR) .................. 10-2004-0027130

(51) Int. Cl.
*G11C 7/12* (2006.01)
(52) U.S. Cl. .................. 365/203; 365/149; 365/189.11
(58) Field of Classification Search .................. 365/204
See application file for complete search history.

(56) References Cited

U.S. PATENT DOCUMENTS

| | | | | |
|---|---|---|---|---|
| 5,257,232 A | * | 10/1993 | Dhong et al. ............... | 365/203 |
| 5,623,446 A | * | 4/1997 | Hisada et al. ........... | 365/189.11 |
| 5,673,232 A | * | 9/1997 | Furutani .................... | 365/226 |
| 5,689,461 A | * | 11/1997 | Kaneko et al. ........ | 365/189.11 |
| 5,703,814 A | * | 12/1997 | Nishimura et al. .... | 365/189.09 |
| 5,724,286 A | * | 3/1998 | Gillingham ............ | 365/189.11 |
| 5,982,695 A | * | 11/1999 | Mukai ........................ | 365/226 |
| 6,038,186 A | * | 3/2000 | Tanizaki .................... | 365/222 |
| 6,243,310 B1 | * | 6/2001 | Condemi et al. ........... | 365/203 |
| 6,751,152 B2 | | 6/2004 | Hsu et al. | |

FOREIGN PATENT DOCUMENTS

JP    06-290588    10/1994

* cited by examiner

*Primary Examiner*—Tan T. Nguyen
(74) *Attorney, Agent, or Firm*—Lowe Hauptman Ham & Berner LLP (57) ABSTRACT

A bit line equalization signal (BLEQ) driving circuit for generating an equalization signal used to perform a precharge operation in a semiconductor memory device includes a second boosted voltage generator for producing a second boosted voltage by pumping a supply voltage, a BLEQ driver for generating the equalization signal by using the second boosted voltage in response to an equalization command and providing the equalization signal to a precharge unit, an equalizer and an I/O switch module. By using the second boosted voltage VPUP, which is lower than a first boosted voltage and higher than the supply voltage, as the equalization signal to be provided to gates of transistors for precharging a low power device to a precharge voltage level, it is possible to save current that a voltage pump consumes and satisfy a constant tRP.

10 Claims, 8 Drawing Sheets

BLEQ DRIVING CIRCUIT IN SEMICONDUCTOR MEMORY DEVICE

FIELD OF THE INVENTION

The present invention relates to a bit-line equalization signal (BLEQ) driving circuit used in a semiconductor memory device; particularly to a BLEQ driving circuit usable in the low voltage (VDD) environment and a semiconductor memory device employing the driving circuit.

BACKGROUND OF THE INVENTION

It becomes a trend to design a semiconductor memory device having high capacity and high operational speed. Furthermore, it is noticed that a memory device is designed to operate at low voltage or low power to acquire reliable performance at the low power environment. In particular, it is a trend to design a memory device employed in a portable system such as a mobile phone, a notebook computer, etc. to consume the minimum power if possible.

One of the efforts is a technology of reducing current consumption at a core area of a memory device to the minimum. The core area including memory cells, bit lines and word lines is designed according to an extremely delicate design-rule. As a result, the memory cell has a very small size and consumes low power.

A dynamic random access memory (DRAM) widely used in this world employs a bit line precharge operation therein. The bit line precharge operation is to precharge bit lines with a certain voltage value corresponding to an input voltage level of sense amplifiers that judge logical states of data stored in the DRAM, and is performed before a data reading or writing operation. A charged voltage of a cell capacitor in the memory cell corresponding to a logical value "1" is referred to as VCORE and a precharge voltage becomes a half of VCORE.

Figure 1:
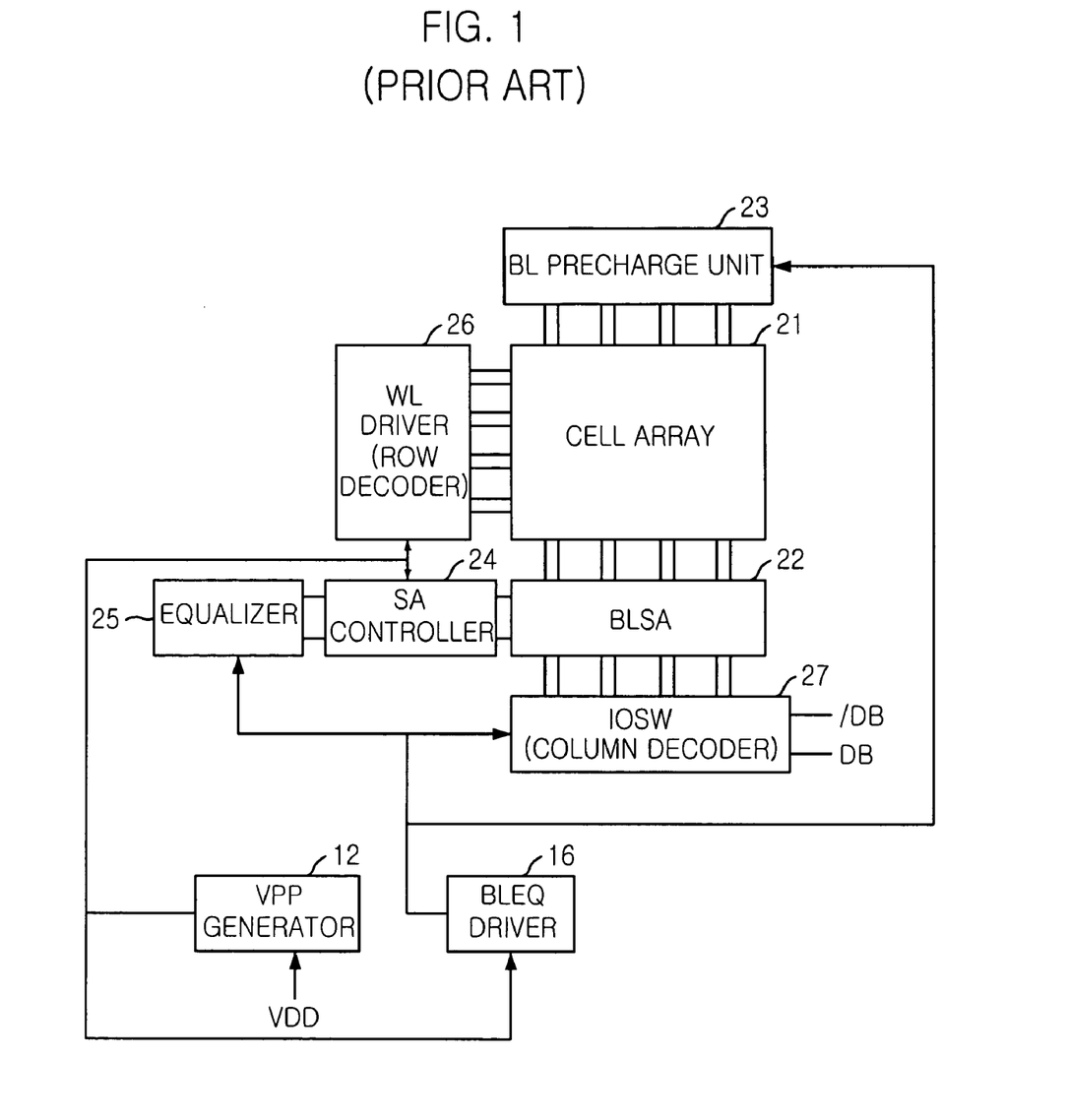
FIG. 1 shows one example block diagram of a core area in a conventional memory device.

Referring to FIG. 1, there is shown one example block diagram of a core area in a conventional DRAM device.

The conventional DRAM device includes a cell array 21, a word line (WL) driver 26, a bit line precharge unit 23, a bit line sense amplifying block 22, an input-output block 27, a sense amplifier (SA) controller 24, an equalizer 25, a boosted voltage generator 12 and an equalization signal (BLEQ) driver 16.

In a low power memory device, a storage voltage VCORE of a cell array has a higher level than a supply voltage VDD provided from the outside of the memory device. Moreover, since switches existing at several places in the memory device having cell transistors are mostly formed with MOS transistors, there exists the voltage loss due to gate voltage drop (Vt) of the MOS transistors. Therefore, in order to charge memory cell capacitors with full VCORE by providing a voltage higher than (VCORE+Vt) to gates of cell transistors, a substantially higher voltage than (VCORE+Vt) should be coupled to bit lines. This voltage is generated by pumping the supply voltage VDD and called as a boosted voltage VPP. The memory device includes a boosted voltage generator to produce the boosted voltage VPP.

As described in FIG. 1, in the conventional memory device, the boosted voltage VPP outputted from the boosted voltage generator 12 is provided to the word line (WL) driver 26 and the sense amplifier (SA) controller 24. The boosted voltage VPP is also inputted to the equalization signal (BLEQ) driver 16 as the equalization signal (BLEQ) output voltage.

Using the boosted voltage VPP as the equalization signal BLEQ is called a VPP driving scheme (boosted voltage driving scheme). However, when using this scheme, the driving performance of the boosted voltage VPP may be substantially deteriorated in a range of an operational voltage being lower than 2.0V. In particular, this phenomenon becomes more serious in the low power environment.

In order to generate the boosted voltage VPP having 3.6V from the supply voltage of conventional 2.5V or 3.3V, it is enough to pump 50% or 10% of the supply voltage. That is, one time pumping is sufficient to get the boosted voltage VPP of 3.6V. On the other hand, in order to produce the boosted voltage VPP of 3.6V from the supply voltage of 1.5V or 1.8V, there is required more than 100% voltage pumping of the supply voltage VDD. This is achieved by twice voltage pumping. As a result, the driving performance of the boosted voltage is substantially deteriorated.

In addition, when driving transistors to be switched during a bit line precharge operation by using the boosted voltage, a voltage level of the boosted voltage VPP becomes dropped. If the voltage level of the boosted voltage VPP is dropped, the bit line precharging speed is delayed. Furthermore, word line enablement performed by the boosted voltage VPP is also delayed or there may occur a problem in a refresh operation due to the voltage level down. Also, current consumption increases by driving the boosted voltage generator so as to elevate the dropped voltage level of the boosted voltage. As a result lots of boosted voltage generators should be employed in the memory device.

Figure 2:
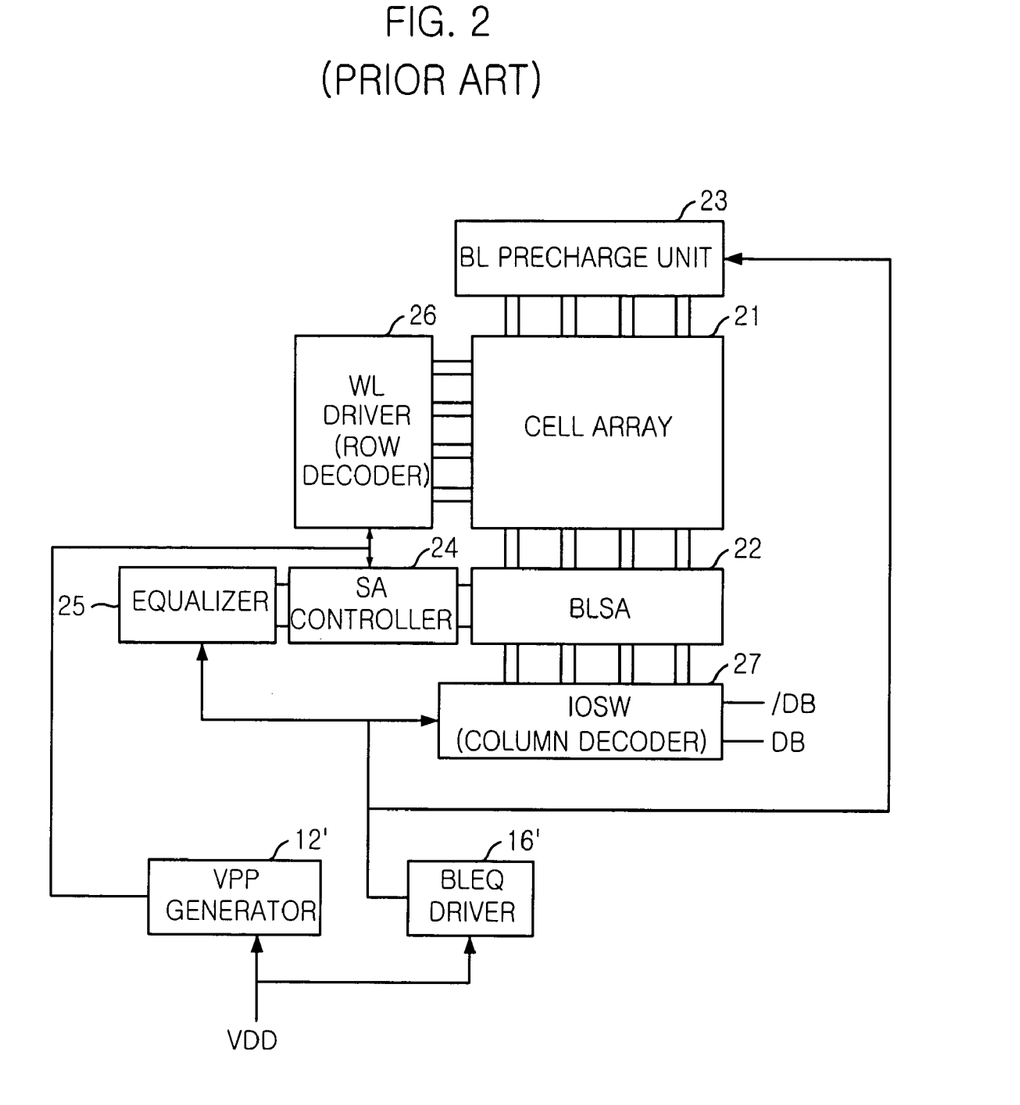
FIG. 2 illustrates another example block diagram of the core area in the conventional memory device.

Referring to FIG. 2, there is illustrated another example block diagram of the core area in the conventional DRAM device. In this example, the supply voltage VDD is used as the equalization signal BLEQ, i.e., inputted to an equalization signal (BLEQ) driver 16'. The boosted voltage VPP is only used at the WL driver 26 transmitting VCORE and the SA controller 24 and it is enough to use the equalization signal BLEQ which has a voltage level higher than (½VCORE+Vt). However, if applying the conventional bit line precharging scheme using the supply voltage VDD to the low power memory device, there occurs speed delay by a relatively boosted back bias and a lowered supply voltage, resulting in deteriorating a time constant tRP relating to a precharge time. That is, in case of using the supply voltage VDD as the BLEQ signal, since a time required in adjusting voltage level of relating circuits to a precharge voltage VBLP becomes longer, it is difficult to set the relating circuits with the precharge voltage VBLP before a next active time tRP. As a result, the possibility of a precharge operation to be failed becomes higher.

SUMMARY OF THE INVENTION

It is, therefore, an object of the present invention to provide a memory device capable of preventing the deterioration of tRP performance and current waste required in generating a boosted voltage VPP which is used to drive its bit line equalization signal driving circuit.

In accordance with one aspect of the present invention, there is provided an equalization signal (BLEQ) driving circuit in a semiconductor memory device that includes a bit line precharge unit and a word line driver, comprising: a boosted voltage generator for producing a boosted voltage VPUP for an equalization signal by pumping a supply voltage, and an equalization signal driver for generating the equalization signal by using the boosted voltage in response to an equalization command, and providing the equalization signal to the precharge unit, wherein the boosted voltage VPUP has a lower voltage level than that of a boosted voltage VPP for the word line driver.

In accordance with another aspect of the present invention, there is provided a semiconductor memory device including a cell array, a precharge unit, a bit line sense amplifier, a word line driver, an I/O switch module, a sense amplifier controller, a sense amplifier driver equalizer, which comprises:

a first boosted voltage generator for producing a first boosted voltage VPP by pumping a supply voltage VDD;

a second boosted voltage generator for outputting a second boosted voltage VPUP lower than the first boosted voltage VPP by pumping the supply voltage; and an equalization signal driver for outputting the second boosted voltage VPUP as an equalization signal in response to an equalization command and providing the equalization signal to the precharge unit.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, with reference to the drawings, some of the preferred embodiments of the present invention will be explained in detail.

Figure 3:
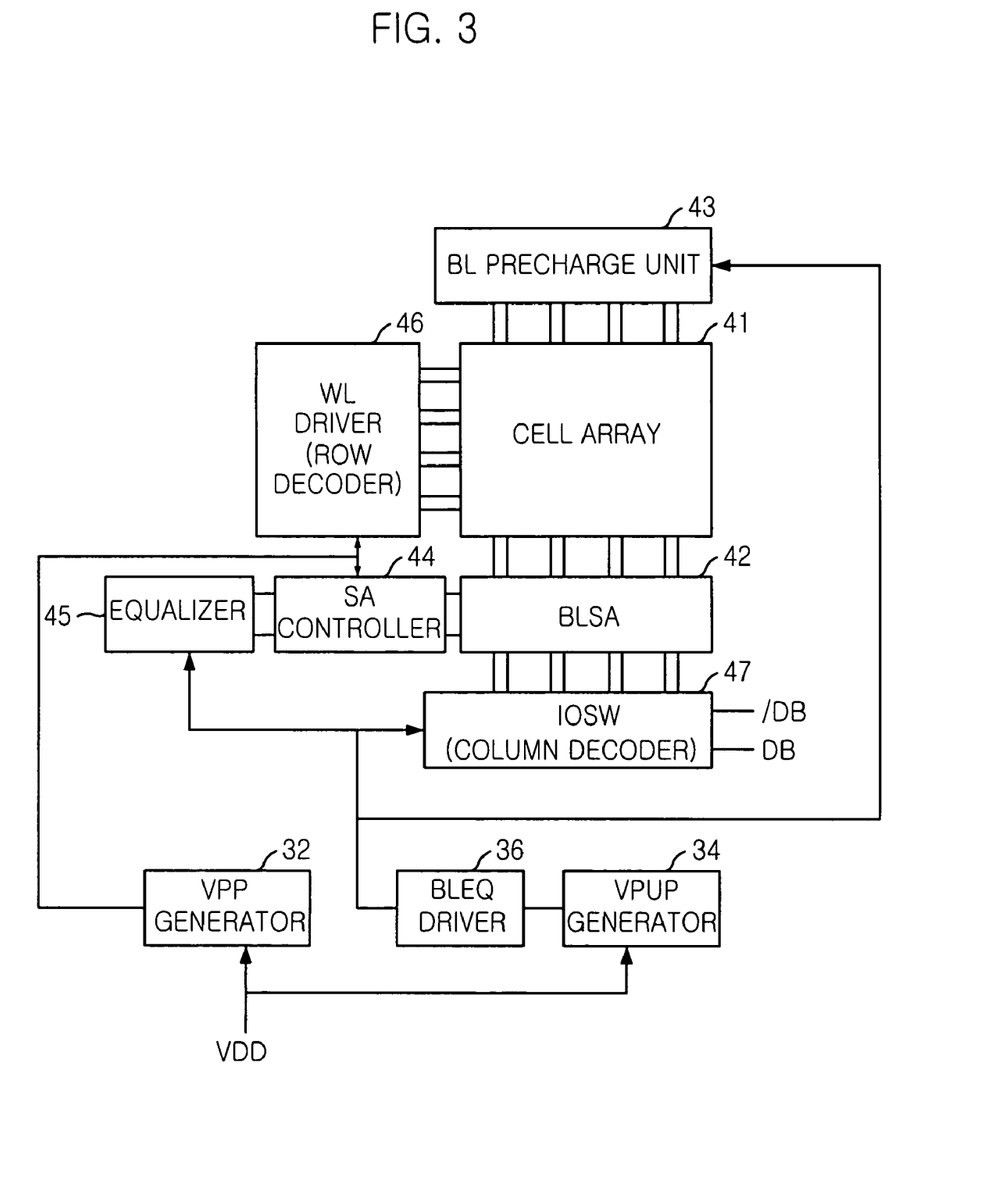
FIG. 3 is a block diagram of a core area in a memory device in accordance with a first embodiment of the present invention.

FIG. 3 shows a block diagram of a memory device in accordance with a first embodiment of the present invention.

The memory device described in FIG. 3 includes a core area, a first boosted voltage (VPP) generator 32, a second boosted voltage (VPUP) generator 34 and an equalization signal (BLEQ) driver 36.

Herein, the core area includes a cell array 41, a bit line (BL) precharge unit 43, a bit line sense amplifier (BLSA) 42, a word line (WL) driver 46, a sense amplifier (SA) controller 44, an equalizer 45 and an input/output switch (IOSW) 47.

The cell array 41 consists of a plurality of memory cells in which data are stored and the bit line (BL) precharge unit 43 adjusts a pair of bit lines with a precharge voltage. The bit line sense amplifier (BLSA) 42 amplifies voltage difference of the bit lines induced by a storage value of a memory cell corresponding to the BLSA 42. The word line (WL) driver 46 transmits a driving signal to a word line corresponding to an inputted row address. The sense amplifier (SA) controller 44 provides the driving power to the BLSA 42. The equalizer 45 adjusts a voltage of a driving power supply line of the BLSA 42 with the precharge voltage. The input/output switch (IOSW) 47 selects a bit line to be connected to a DB line among actuated bit lines.

The VPP generator 32 is to get the first boosted voltage VPP. Since the first boosted voltage VPP is substantially higher than an external supply voltage, it is used to compensate threshold voltage loss of a MOS transistor and provide sufficient power to a load. In a recent low power device, since a supply voltage has a voltage level lower than 2V, the VPP generator 32 produces the first boosted voltage VPP by pumping the supply voltage more than two times.

The VPUP generator 34 additionally included in the present invention produces the second boosted voltage VPUP by pumping the supply voltage VDD. In case of a low power device having the supply voltage VDD of about 1.5 to 1.6V, the VPUP generator 34 can obtain the second boosted voltage VPUP of 2.6 to 3.0V by pumping the supply voltage VDD one time.

In accordance with the present invention, the VPUP generator 34 is added to avoid the use of the first boosted voltage VPP in the supply of the equalization signal BLEQ. If the first boosted voltage VPP is used as the equalization voltage, when switching MOS transistors are turned on, there result in performance deterioration of the first boosted voltage VPP, overload to the VPP generator 32 and power waste due to the performance deterioration and the overload.

The equalization signal BLEQ is generated under the control of a bit line equalization command and provided to the equalizer 45, the precharge unit 43 and the IOSW 47. The equalization signal BLEQ is coupled to gates of the switching MOS transistors as a driving signal for the precharge operation.

Figure 10:
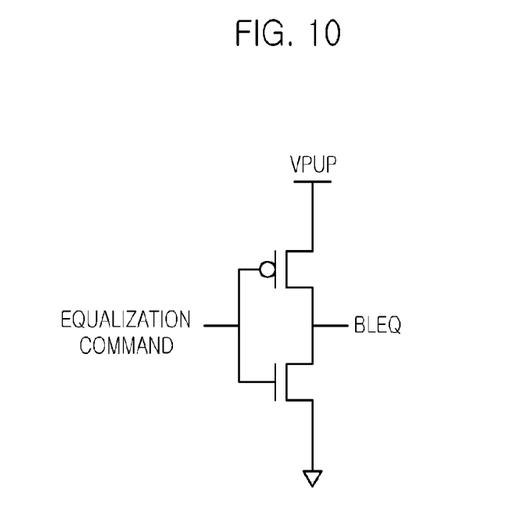
FIG. 10 describes a circuit diagram of an equalization signal (BLEQ) driver in FIG. 3.

In accordance with this embodiment of the present invention, there is further employed the BLEQ driver 36 generating the equalization signal BLEQ by using the second boosted voltage VPUP outputted from the VPUP generator 34. The BLEQ driver 36 can be simply formed with one switching MOS transistor that outputs an equalization voltage by switching the second boosted voltage VPUP in response to the equalization command. However, it is preferable to form the BLEQ driver 36 with a switch consisting of a pair of NMOS and PMOS transistors as shown in FIG. 10. The equalization command is supplied to the BLEQ driver 36 from a sensing operation controlling unit (not shown) at a moment of the sensing operation of the BLSA 42 finished.

Figure 7:
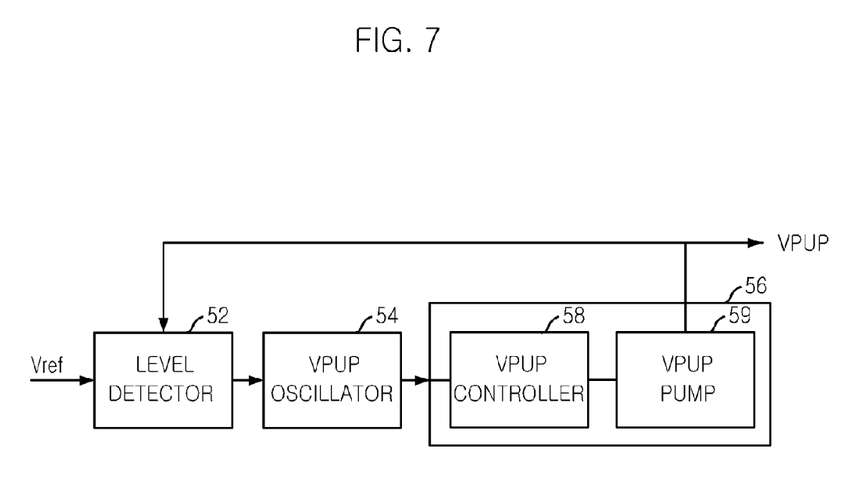
FIG. 7 shows a block diagram of a second boosted voltage (VPUP) generator in accordance with the present invention.

The VPUP generator 34 can be simply constructed with a voltage pump outputting the second boosted voltage VPUP in response to an oscillation signal that is produced at an oscillator and provided to the voltage pump. However, preferably, as shown in FIG. 7, the VPUP generator 34 includes a level detector 52, connected to a VPUP output node, for outputting a level detection signal by detecting a voltage level of the second boosted voltage VPUP, an oscillator 54 for generating an oscillation signal in response to the level detection signal and providing the oscillation signal to a voltage pump 56, and the voltage pump 56 for outputting the second boosted voltage VPUP in response to the oscillation signal.

The level detector 52 compares the second boosted voltage VPUP outputted from the voltage pump 56 and a reference voltage Vref which is higher than (½VCORE+Vt), wherein ½VCORE is a minimum voltage required in the precharging operation. As a result of the comparison, in case the output voltage of the voltage pump 56 is lower than the reference voltage Vref, a pumping enable signal is outputted to drive the oscillator 54 for performing the pumping. The oscillation signal outputted from the oscillator 54 is supplied to the voltage pump 56. The pumped voltage is generated in the process of storing an electric charge of the oscillation signal at a capacitor in the voltage pump 56 and discharging the stored electric charge.

The oscillator 54 is usually formed with a ring oscillator consisting of an odd number of inverters. The voltage pump 56 contains a VPUP controller 58 for controlling the charging and discharging of a pumping capacitor of a VPUP pump 59 in response to the oscillation signal and the VPUP pump 59 for executing the pumping operation in response to a control signal outputted from the VPUP controller 58.

Figure 9:
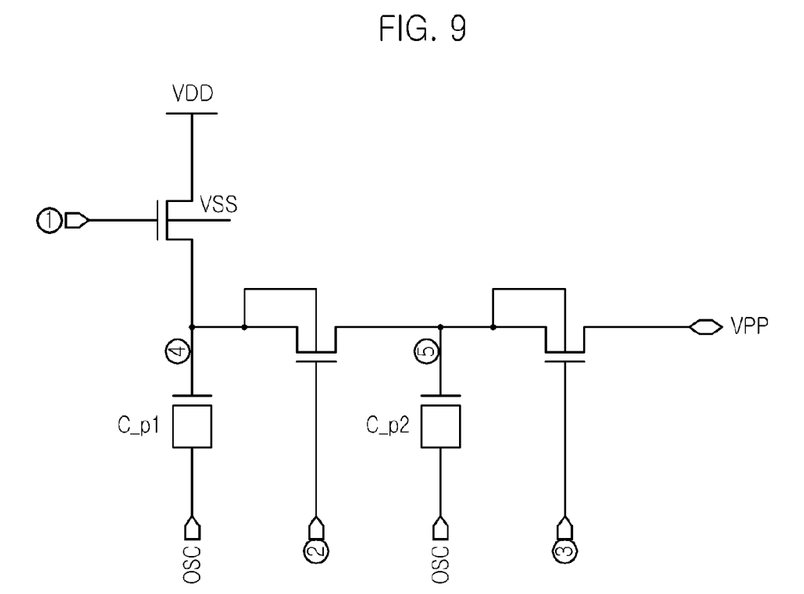
FIG. 9 provides a circuit diagram of a first boosted voltage (VPP) pump performing two time pumping in accordance with an embodiment of the present invention.

FIG. 9 shows a tripler voltage pump having an NMOS transfer type that generates the first boosted voltage VPP by pumping the supply voltage VDD two times and can be used in the VPP generator 32.

Figure 8:
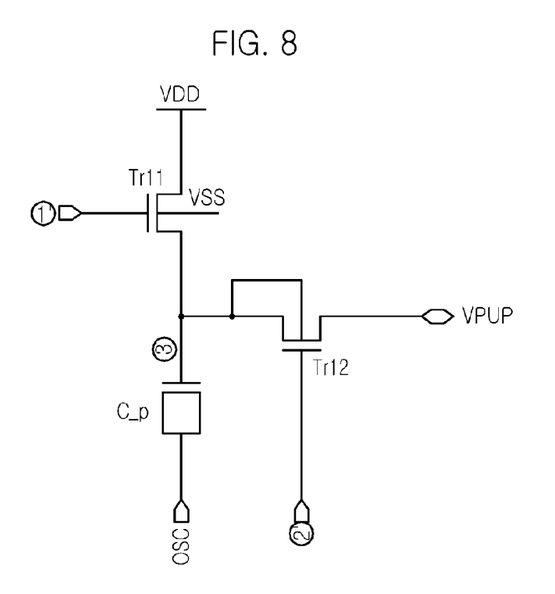
FIG. 8 illustrates a circuit diagram of a VPUP pump performing one time pumping in accordance with an embodiment of the present invention.

FIG. 8 describes a dubbler voltage pump having an NMOS transfer type which produces the second boosted voltage VPUP by pumping the supply voltage VDD one time and can be utilized in the VPUP generator 34.

In FIG. 8, a clock OSC toggled in a certain period and generated by the oscillator 54 is inputted to a pumping capacitor C_p of the voltage pump 56. If the clock OSC has a low state, since the pumping capacitor C_p is charged with the supply voltage VDD, a node ③ has electric potential of VDD. On the other hand, if the clock OSC is transited to a high state, since a transistor Tr11 is turned off and, therefore, the electric potential of the clock OSC and that of the pumping capacitor C_p are added, the node ③ has electric potential of 2VDD. When the electric potential of the node ③ sufficiently goes up, a transistor Tr12 is turned on and the boosted voltage VPUP is generated to a load capacitor.

In FIG. 9, the tripler voltage pump generating the first boosted voltage VPP contains a node ④ of electric potential of 2VDD obtained from the charging and the switching of a first pumping capacitor C_p1 and a node ⑤ of electric potential of 3VDD theoretically obtained from the charging and the switching of a second pumping capacitor C_p2 through the same process as described above.

In a device having a supply voltage VDD of 1.6V, it is preferable that the first boosted voltage generator is implemented with the tripler voltage pump performing the two time pumping and the second boosted voltage generator is formed with the dubbler voltage pump executing the one time pumping. In this case, an equalization signal having 3.1V is obtained from the supply voltage VDD of 1.6V and the boosted voltage VPP of 4.2V is obtained to drive the word line driver and the sense amplifier.

Under the control of the equalization command provided to the equalization signal (BLEQ) driver 36, the equalization signal BLEQ is activated by pumping the electric potential of a BLEQ outputting line to the second boosted voltage VPUP. The equalization command is activated in a precharge operation and the equalization signal BLEQ generated at that time has functions to be described hereinafter.

Figure 5:
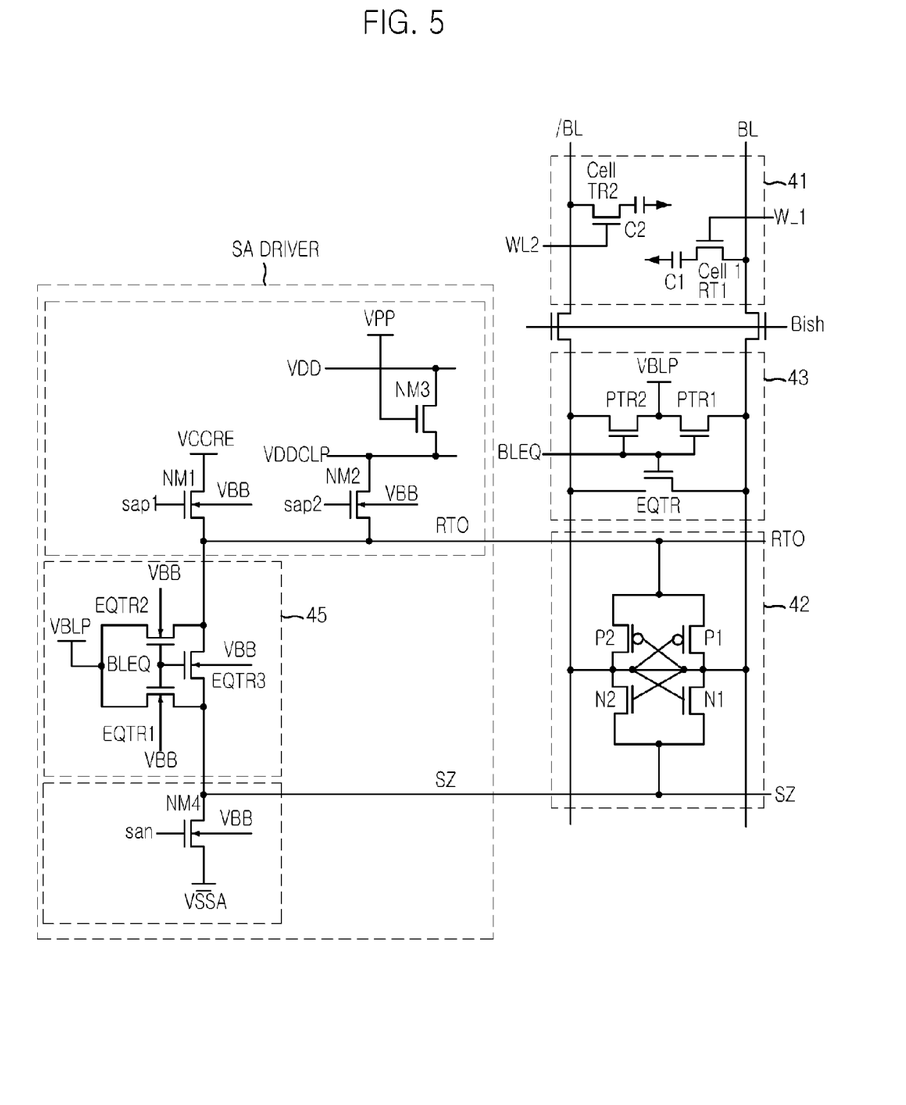
FIG. 5 describes a detailed circuit diagram of an equalizer and a precharge unit in FIG. 3.
Figure 6:
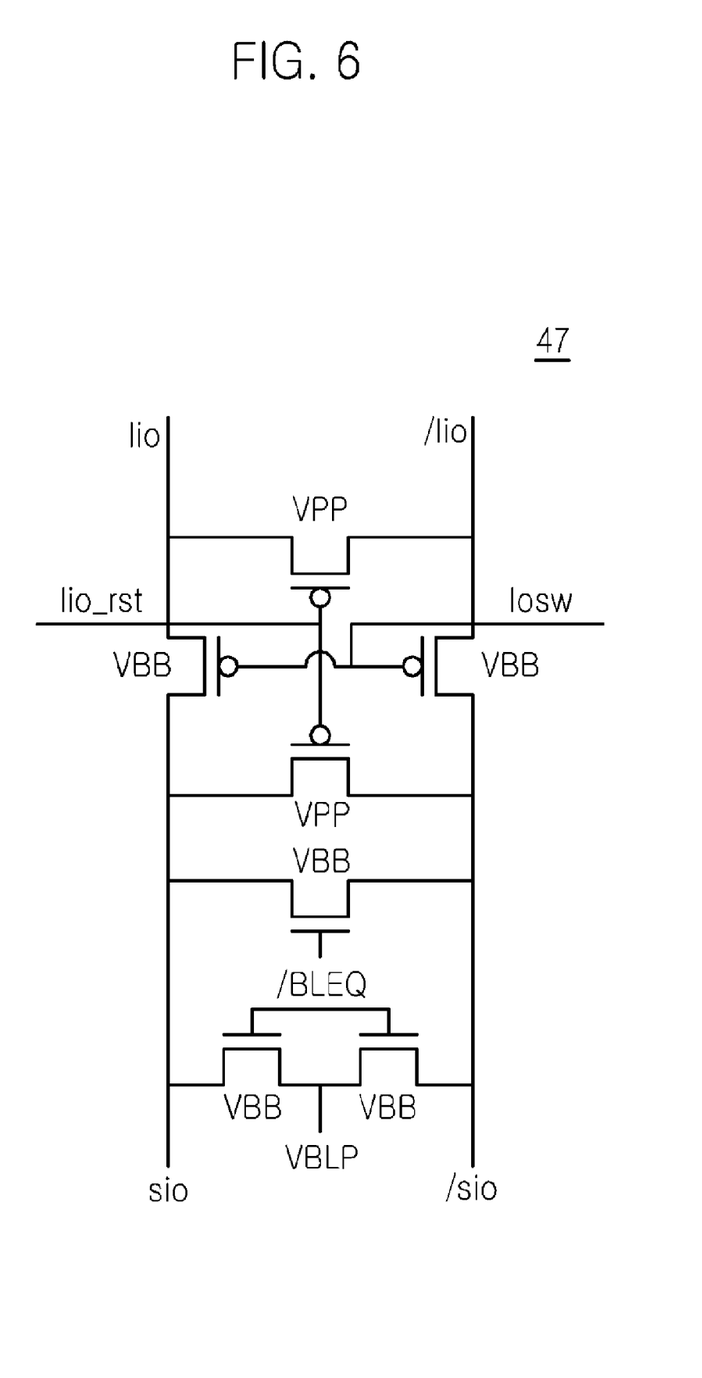
FIG. 6 represents a detailed circuit diagram of an IOSW module in FIG. 3.

FIG. 5 describes a detailed circuit diagram of the equalizer 45 and the precharge unit 43 to which the equalization signal BLEQ is provided. FIG. 6 represents a detailed circuit diagram of the IOSW module 47 to which the equalization signal BLEQ is coupled.

In FIG. 5, the precharge unit 43 sets a voltage level of each bit line and inverted bit lines to the precharge voltage VBLP (=½VCORE) when precharging the bit lines. That is, the precharge unit 43 precharges the bit line and the inverted bit line whose voltages are changed to VSS and VCORE, respectively, during the sensing operation, with the precharge voltage VBLP, thereby preparing the bit line sensing in a next reading operation. In FIG. 5, if the equalization signal BLEQ is coupled to three NMOS transistors PTR1, PTR2 and EQTR, all of the three NMOS transistors are turned on and, as a result, the voltage levels of the bit line BL and the inverted bit line /BL become the precharge voltage VBLP.

In the precharge operation, the electric potential of a source line RTO of PMOS transistors P1 and P2 of the sense amplifier and that of a source line SZ of NMOS transistors N1 and N2 should have the precharge voltage VBLP and this is achieved by the operation of the equalizer 45 in FIG. 5. The precharge operation is performed by NMOS transistors EQTR1, EQTR2 and EQTR3 that are turned on in response to the equalization signal BLEQ coupled to a gate of the NMOS transistor EQTR3 planarizing the electric potential of both lines of the NMOS transistors EQTR1 and EQTR2 providing the precharge voltage to the lines RTO and SZ. In an active state after the precharge operation is finished, the RTO line has the electric potential of VCORE and the SZ line has the electric potential of VSS.

In the precharge operation, output lines sio and /sio of the sense amplifier should be set to the precharge voltage VBLP. This operation is executed by three NMOS transistors EQTR7, EQTR8 and EQTR9 turned on in response to the equalization signal BLEQ like at the IOSW module 47 in FIG. 6.

Figure 4:
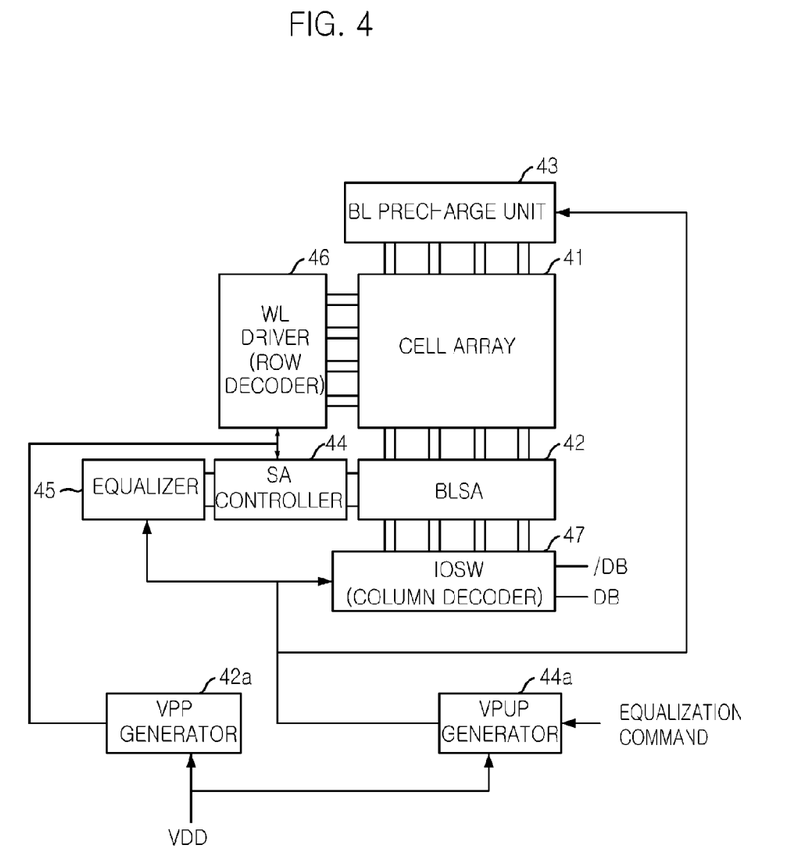
FIG. 4 provides a block diagram of a core area in a memory device in accordance with a second embodiment of the present invention.

In accordance with another embodiment of the present invention, the semiconductor memory device in FIG. 4, including the cell array 41, the precharge unit 43, the bit line sense amplifier (BLSA) 42, the word line (WL) driver 46, the IOSW module 47, the sense amplifier (SA) controller 44 and the sense amplifier driver equalizer 45, contains a first boosted voltage (VPP) generator 42a for producing the first boosted voltage VPP to be used as a driving source of the word line driver 46 by voltage-pumping the supply voltage VDD and a second boosted voltage (VPUP) generator 44a for producing the second boosted voltage VPUP lower than the first boosted voltage VPP by pumping the supply voltage VDD. Herein, the second boosted voltage VPUP is used as the equalization signal BLEQ of the precharge unit 43, the equalizer 45 and the IOSW module 47.

The semiconductor memory device in accordance with this embodiment of the present invention is obtained by omitting the BLEQ driver 36 from the first embodiment of the present invention in FIG. 3. In this embodiment, the VPUP generator 44a is provided with the bit line equalization command.

The structure in accordance with this embodiment is identical to that of the first embodiment except that there is no BLEQ driver and the second boosted voltage VPUP is directly provided to the precharge unit 43, the equalizer 45 and the IOSW module 47. Therefore, the explanation about the identical components is omitted.

As shown in FIG. 7, it is preferable that, when the VPUP generator 44 contains the level detector 52, connected to the VPUP output node, for outputting the level detection signal by detecting a level of the second boosted voltage VPUP, the oscillator 54 for producing the oscillation signal in response to the level detection signal and the voltage pump 56 for outputting the second boosted voltage VPUP in response to the oscillation signal, the equalization command is used to switch the operation of the oscillator 54 and/or the voltage pump 56.

In accordance with a third embodiment of the present invention, a new equalization signal driving circuit is formed by grouping the BLEQ driver 36 and the VPUP generator 34 of the first embodiment to one block.

The new equalization signal driving circuit includes the VPUP generator 34 for producing a separate boosted voltage VPUP for the equalization signal BLEQ by pumping the supply voltage VDD, and a BLEQ driver for generating the equalization signal BLEQ based on the separate boosted voltage VPUP and providing the equalization signal BLEQ to the precharge unit 43, the equalizer 45 and the IOSW module 47.

The separate boosted voltage VPUP for the equalization signal BLEQ has a lower voltage level than that of the boosted voltage VPP provided as a driving voltage of the WL driver and the SA controller in the memory device. The VPUP generator 34 performs appropriate pumping times according to a voltage level of the supply voltage VDD. In a current condition of the supply voltage VDD, it is sufficient to perform only one time of pumping. In a simple case, the VPUP generator is formed with the oscillator and the voltage pump.

In order to generate a more stabilized equalization signal BLEQ, as described in FIG. 7, it is preferable that the VPUP generator employs the level detector 52, connected to the VPUP output node, for outputting the level detection signal by detecting a level of the boosted voltage VPUP, the oscillator 54 for generating the oscillation signal based on the level detection signal and the voltage pump 56 for outputting the boosted voltage VPUP in response to the oscillation signal coupled thereto from the oscillator 54. The detailed structure and the operation of each component of the VPUP generator are identical to those of the first embodiment.

In many cases, the oscillator 54 is implemented with a ring oscillator having an odd number of inverters rotationally connected. The voltage pump 56 contains a voltage controller 58 for generating a control signal which is used to control the charging and discharging of a pumping capacitor of a pumping unit 59 based on the oscillation signal of the oscillator 54, and the pumping unit 59 for performing the pumping operation in response to the control signal. The voltage pump can be formed with the dubbler voltage pump having the NMOS transistor type described in FIG. 8.

The BLEQ driver is simply formed with one MOS transistor that outputs the equalization signal BLEQ by switching the second boosted voltage VPUP in response to the equalization command, or a structure illustrated in FIG. 10.

In accordance with the present invention, the low power device generates an internal supply voltage called the second boosted voltage VPUP whose voltage level is lower than that of the first boosted voltage VPP and higher than that of the supply voltage VDD by using the dubbler pump and uses the internal supply voltage as the equalization signal BLEQ provided to gates of transistors for precharging related circuits with the precharge voltage VBLP. As a result, it is possible to reduce the current consumption compared to the case of using the first boosted voltage VPP as the equalization signal BLEQ, and to improve the reliability of a device by satisfying a constant tRP compared to the case of using the supply voltage VDD as the equalization signal BLEQ.

That is, in accordance with the present invention, it is possible to achieve both of the reduction of the current consumption and the performance improvement of tRP, which were the trade-off to each other.

The present application contains subject matter related to Korean patent application No. 2004-27130, filed in the Korean Patent Office on Apr. 20, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An equalization signal driving circuit in a semiconductor memory device that includes a bit line precharge unit and a word line driver, comprising:
   a boosted voltage generator for producing a boosted voltage for an equalization signal by pumping an external supply voltage, wherein the boosted voltage generator includes a voltage pump for outputting the boosted voltage in response to an oscillation signal and wherein the voltage pump includes a voltage controlling unit for controlling the charging and discharging of a pumping capacitor of a pumping unit in response to the oscillation signal and the pumping unit for performing voltage pumping by receiving an output of the voltage controlling unit; and
   an equalization signal driver for generating the equalization signal by using said boosted voltage in response to an equalization command, and providing the equalization signal to the precharge unit,
   wherein said boosted voltage has a lower voltage level than a boosted voltage for the word line driver.

2. The equalization signal driving circuit as recited in claim 1, wherein the boosted voltage generator includes:
   a level detector, connected to a boosted voltage output node, for detecting a voltage level of said boosted voltage, thereby outputting a detection signal; and
   an oscillator for generating the oscillation signal under the control of the detection signal.

3. The equalization signal driving circuit as recited in claim 1, wherein the boosted voltage generator produces said boosted voltage by pumping the external supply voltage one time.

4. A semiconductor memory device having a precharge unit, which comprises:
   a first boosted voltage generator for producing a first boosted voltage by pumping an external supply voltage;
   a second boosted voltage generator for outputting a second boosted voltage lower than the first boosted voltage by pumping the external supply voltage, wherein the second boosted voltage generator includes a voltage pump for outputting the second boosted voltage in response to an oscillation signal and wherein the voltage pump includes a voltage controlling unit for outputting a control signal which is used for controlling the charging and discharging of a pumping capacitor of a pumping unit in response to the oscillation signal and the pumping unit for performing the voltage pumping in response to the control signal; and
   an equalization signal driver for outputting the second boosted voltage as an equalization signal in response to an equalization command and providing the equalization signal to the precharge unit.

5. The semiconductor memory device as recited in claim 4 further comprising a word line driver, wherein the first boosted voltage is supplied to the word line driver as a driving source.

6. The semiconductor memory device as recited in claim 5, wherein the second boosted voltage generator includes:
   a level detector, connected to a second boosted voltage output node, for detecting a level of the second boosted voltage and outputting a level detection signal; and
   an oscillator for generating the oscillation signal in response to the level detection signal.

7. The semiconductor memory device as recited in claim 5, wherein the first boosted voltage generator produces the first boosted voltage by pumping the external supply voltage two times and the second boosted voltage generator produces the second boosted voltage by pumping the external supply voltage one time.

8. A semiconductor memory device including a precharge unit and a word line driver, which comprises:
   a first boosted voltage generator for producing a first boosted voltage coupled to the word line driver by boosting a supply voltage; and
   a second boosted voltage generator for producing a second boosted voltage by boosting the supply voltage in response to an equalization command, wherein the second boosted voltage has a voltage level lower than that of the first boosted voltage and is provided to the precharge unit, wherein the second boosted voltage generator includes a voltage pump for outputting the second boosted voltage in response to an oscillation signal and wherein the voltage pump includes a voltage controlling unit for outputting a control signal which is used for controlling the charging and discharging of a pumping capacitor of a pumping unit in response to the oscillation signal and the pumping unit for performing the voltage pumping in response to the control signal.

9. The semiconductor memory device as recited in claim 8, wherein the second boosted voltage generator includes:
   a level detector, connected to a second boosted voltage output node, for detecting a voltage level of the second boosted voltage to thereby output a level detection signal; and
   an oscillator for generating the oscillation signal in response to the level detection signal.

10. semiconductor memory device as recited in claim 8, wherein the first boosted voltage generator produces the first boosted voltage by pumping the supply voltage two times and the second boosted voltage generator produces the second boosted voltage by pumping the supply voltage one time.

* * * * *